United States Patent
Cheng et al.

(10) Patent No.: US 12,127,363 B2
(45) Date of Patent: Oct. 22, 2024

(54) COMPRESSION MOUNTED TECHNOLOGY (CMT) SOCKET RETENTION MECHANISMS TO BOARD OR INTERPOSER

(71) Applicant: Intel Corporation, Santa Clara, CA (US)

(72) Inventors: Feifei Cheng, Chandler, AZ (US); Thomas Boyd, Vancouver, WA (US); Kuang Liu, Queen Creek, AZ (US); Steven A. Klein, Chandler, AZ (US); Daniel Neumann, Newberg, OR (US); Mohanraj Prabhugoud, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 17/033,401

(22) Filed: Sep. 25, 2020

(65) Prior Publication Data
US 2022/0102887 A1    Mar. 31, 2022

(51) Int. Cl.
*H05K 7/10* (2006.01)
*H01R 12/52* (2011.01)

(52) U.S. Cl.
CPC ......... *H05K 7/1069* (2013.01); *H01R 12/523* (2013.01)

(58) Field of Classification Search
USPC .......................................... 439/248
See application file for complete search history.

(56) References Cited

U.S. PATENT DOCUMENTS

| | | | |
|---|---|---|---|
| 5,064,380 A * | 11/1991 | Dale | H01R 25/003 439/492 |
| 9,685,722 B2 * | 6/2017 | Ueyama | H05K 1/18 |

* cited by examiner

*Primary Examiner* — Ross N Gushi
(74) *Attorney, Agent, or Firm* — Schwabe, Williamson & Wyatt P.C.

(57) ABSTRACT

Embodiments disclosed herein include sockets and electronic packages with socket architectures. In an embodiment, a socket comprises a housing with a first surface and a second surface. In an embodiment, a plurality of interconnect pins pass through the housing. In an embodiment, an alignment hole is provided through the housing. In an embodiment, an alignment post extending out from the first surface of the housing is also provided.

25 Claims, 14 Drawing Sheets

COMPRESSION MOUNTED TECHNOLOGY (CMT) SOCKET RETENTION MECHANISMS TO BOARD OR INTERPOSER

TECHNICAL FIELD

Embodiments of the present disclosure relate to semiconductor devices, and more particularly to electronic package assemblies that include compression mounted technology (CMT) socket architectures.

BACKGROUND

Socket architectures have been widely adopted in many electronic packaging architectures. CMT socket architectures have been particularly beneficial in large pin count architectures, such as server applications for its greater scalability, superior HSIO performance, and lower demand on enabling load. However, the use of CMT socket architectures is not without issue. One such issue is the assembly of the electronic package. Typically, the alignment of the pins is done with a "blind" assembly process. That is, the pin/hole alignment features of existing socket solutions are not visible from the top during assembly. A such, it is difficult for the operator to align and assemble the socket onto the board/interposer. This may lead to defects, such as bent contacts during assembly, which may lead to electrical failure. Additionally, skiving and/or foreign material generation may occur when the press fit is too tight or too loose. As such, existing solutions have a high risk of damage during assembly. Additionally, if rework is needed, a blind disassembly process is also needed. In such instances, the technician will be unaware that the socket may have come loose from the board, and damage to the contacts may occur.

Socket architectures, particularly compression mounted technology (CMT) socket architectures, also face the potential of damage during shipping. For example, before the CPU and heat sink are installed, it is necessary to protect the bottom-side pins and board lands from fretting damage during shipping shock and vibration. Additionally, solutions to shipping damage need to accommodate the need of symmetric loading of CMT interconnect pins in order to minimize damage to the interconnect pins.

EMBODIMENTS OF THE PRESENT DISCLOSURE

Described herein are electronic package assemblies that include compression mounted technology (CMT) socket architectures, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
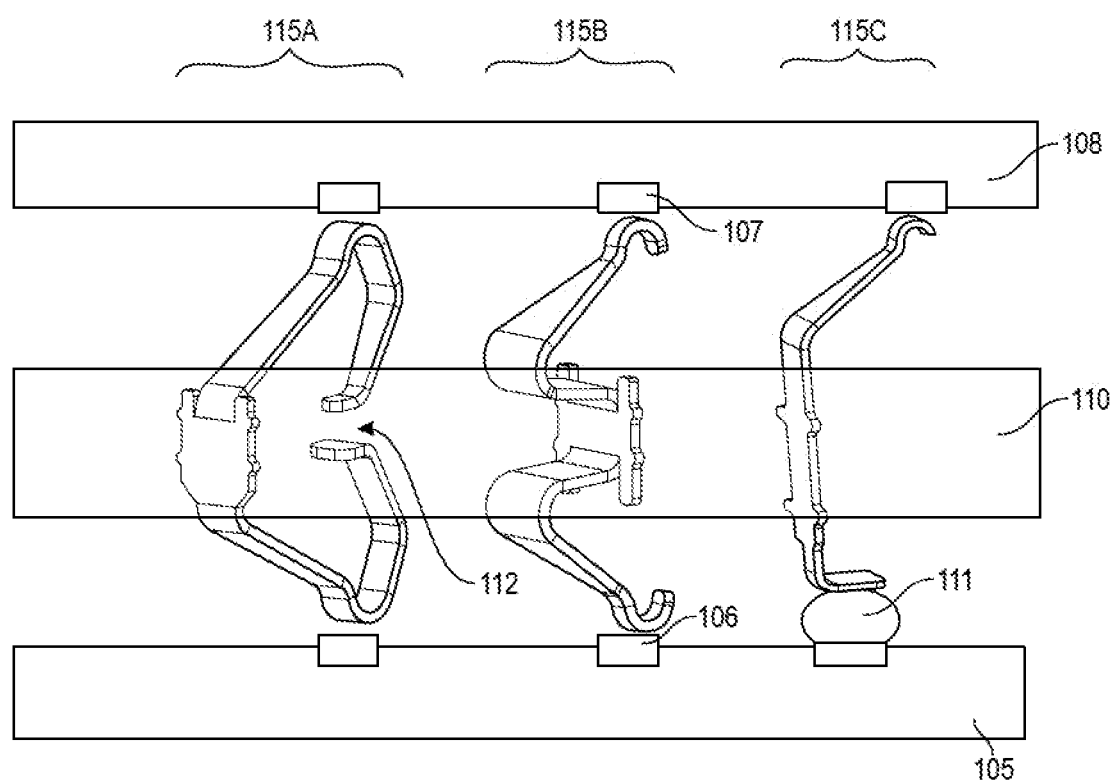
FIG. 1 is a perspective view illustration of various type of interconnect pins used in various socket architectures, in accordance with an embodiment.

In large pin count server architectures, current socketing systems rely on land grid array/ball grid array (LGA/BGA) socket pins. An example of such an interconnect pin 115c is provided in FIG. 1. As shown, the LGA/BGA interconnect pin 115c has an LGA side (top) that is connected to a pad 107 of the package substrate 108 and a BGA side (bottom) that includes a solder ball 111 connected to the pad 106 of the board 105. The interconnect pin 115c passes through a housing 110. However, the drive to larger pin counts and improved performance has led to investigation in so called compression mounted technology (CMT) socket architectures. A pair of such CMT socket interconnects are provided in FIG. 1. As shown, the interconnect pins $115_A$ and $115_B$ have LGA interconnects on both ends. That is, the interconnect pins $115_A$ and $115_B$ are utilized without the presence of a solder BGA ball. The interconnect pin $115_A$ may also include a middle interface feature 112 within the housing 110. When compressed, the middle interface feature 112 comes together to provide an additional path for current. Such interconnect pins $115_A$ are particularly useful for power delivery pins due to the lower resistance. The interconnect pin $115_B$ may be suitable for I/O signaling pins. Though it is to be appreciated that the interconnect pins $115_A$ are not limited to power delivery, and interconnect pins $115_B$ are not limited to I/O signaling.

The use of CMT socket architectures may provide significant benefits compared to traditional LGA/BGA pins $115_C$. For example, compression mounted technology (CMT) socket architectures allow for greater scalability, superior HSIO performance, and lower demand on enabling load. The CMT pins have better pin mechanical compliance and silicon performance. The compliant nature of the socket makes it less sensitive to the scaling effect on socket warpage as form factor increases. Additionally, the CMT socket is not included in the board SMT reflow process. As such, the requirement for a high temperature thermoplastic material for the socket housing is eliminated.

However, as noted above, issues common to socket based architectures, and particularly to CMT socket based architectures, remain. For example, blind assembly and disassembly proves to be problematic. Additionally, there is a need to provide safe shipping conditions for CMT socket architectures. Shipping damage is particularly problematic with CMT socket architectures, since the design of the CMT interconnect pins $115_A$ and $115_B$ require symmetric loading in order to prevent damage. For example, in the case of CMT interconnect pins $115_A$ that include a middle interface feature 112, asymmetric loading may result in the top portion of the CMT interconnect pin $115_A$ deflecting improperly and result in the failure to form the middle interface connection.

Accordingly, embodiments described herein include solutions for reducing the possibility of damage during assembly. This is done by providing an alignment feature that allows for visible alignment to provide an intermediate alignment that properly aligns the blind final precise alignment features. After proper alignment, a series of different fastening systems are provided in order to secure the housing of the socket to a board or interposer without applying a compressive (preloading) force on the CMT interconnect pins.

To provide improve shipping conditions for CMT sockets, a pair of solutions are described. A first solution allows for the CMT socket to float above the board. That is, the CMT interconnect pins are raised up above the pads on the board. As such, vibration and shock induced damage due to the CMT interconnect pins contacting the pads is eliminated. In an additional solution, the CMT interconnect pins are compressed against the pads on the board during shipping. By firmly compressing the CMT interconnect pins, the CMT interconnect pins do not vibrate and move across the pads and damage is minimized. Additionally, such compressive shipping assemblies provide a preload that can be removed when a CPU package is assembled to the system. Such embodiments guarantee a symmetric loading condition on the CMT interconnect pins. As such, damage to the CMT pins resulting from asymmetric loading is avoided.

Figure 2A:
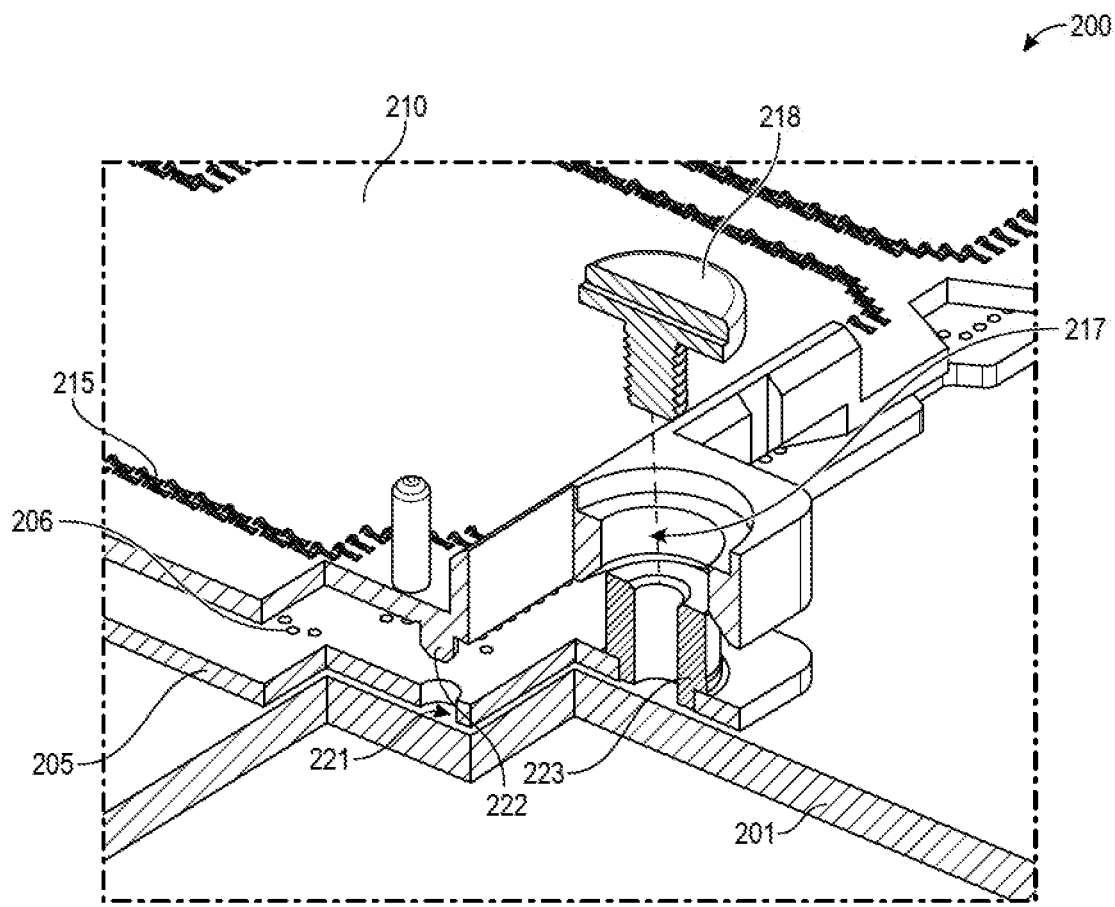
FIG. 2A is a perspective illustration of an electronic package that comprises a pair of alignment features to provide proper alignment and easy assembly of the CMT socket, in accordance with an embodiment.

Referring now to FIG. 2A, a perspective view illustration of an electronic package 200 is shown, in accordance with an embodiment. In an embodiment, the electronic package 200 comprises a board 201 and an interposer 205 attached to the board 201. A socket is over the interposer 205. However, in some embodiments, the socket may be directly attached to the board 201, and the interposer 205 may be omitted.

In an embodiment, the board 201 may be any suitable board 201, such as, but not limited to, a printed circuit board (PCB), a motherboard, or the like. The board 201 may include a plurality of insulating layers with conductive circuitry (not shown) embedded or on the board 201. In an embodiment, the board 201 may comprise a core. In an embodiment, the interposer 205 may comprise insulating layers with conductive circuitry embedded therein. In an embodiment, the interposer 205 may comprise pads 206. The pads 206 may be contacted by interconnect pins 215 that pass through a housing 210 of the socket. In a particular embodiment, the interconnect pins 215 may include CMT pin architectures, such as those described above. In some embodiments, the interconnect pins 215 may comprise middle interface features.

In an embodiment, the interposer 205 and the socket housing 210 may include a pair of alignment features. A first alignment feature may provide an initial coarse alignment, and a second alignment feature may provide the final, more precise, alignment. In an embodiment, the second alignment feature may be considered a blind alignment. That is, from above, the alignment feature is not visible. As such, the first alignment feature, which is visible from above, provides an initial alignment that is close enough to allow for engagement of the second alignment feature without damaging the CMT pins 215.

In an embodiment, the first alignment feature comprises an alignment standoff 223 that extends up from the interposer 205 and an alignment hole 217 that passes through the housing 210. In embodiments where the interposer 205 is omitted, the alignment standoff may extend up from the board 201. In an embodiment, the alignment standoff 223 is soldered to the interposer 205. In other embodiments, the alignment standoff 223 is press-fit into a hole in the interposer 205. In the illustrated embodiment, the alignment standoff 223 is cylindrical in shape with a hole through the center. An interior surface of the alignment standoff 223 may be threaded to receive a fastener 218 that secures the housing 210 to the interposer 205. However, alternative attachment architectures may be provided, as will be described in greater detail below.

The first alignment feature may provide a coarse alignment of the housing 210 to the interposer 205. After the first coarse alignment is made with the first alignment feature, a fine alignment may be provided by the second alignment feature. The second alignment feature may comprise a protrusion 222 that extends out from a bottom surface of the housing 210 and a hole 221 that is provided through or into the interposer 205 (or the board 201 when the interposer 205 is omitted). Despite being a blind installation (i.e., an installation where the protrusion 222 and the hole 221 are not visible to the technician), the second alignment can be made without damaging the interconnect pins 215 or the pads 206 since the first alignment (which is a visible installation) supplies a coarse alignment that brings the protrusion proximate to the hole 221. For example, as shown in FIG. 2A, the alignment standoff 223 has engaged the hole 217, and the protrusion 222 is substantially aligned with the hole 221 so that the continued displacement of the housing 210 towards the interposer 205 will result in the protrusion 222 engaging with the hole 221.

Figure 2B:
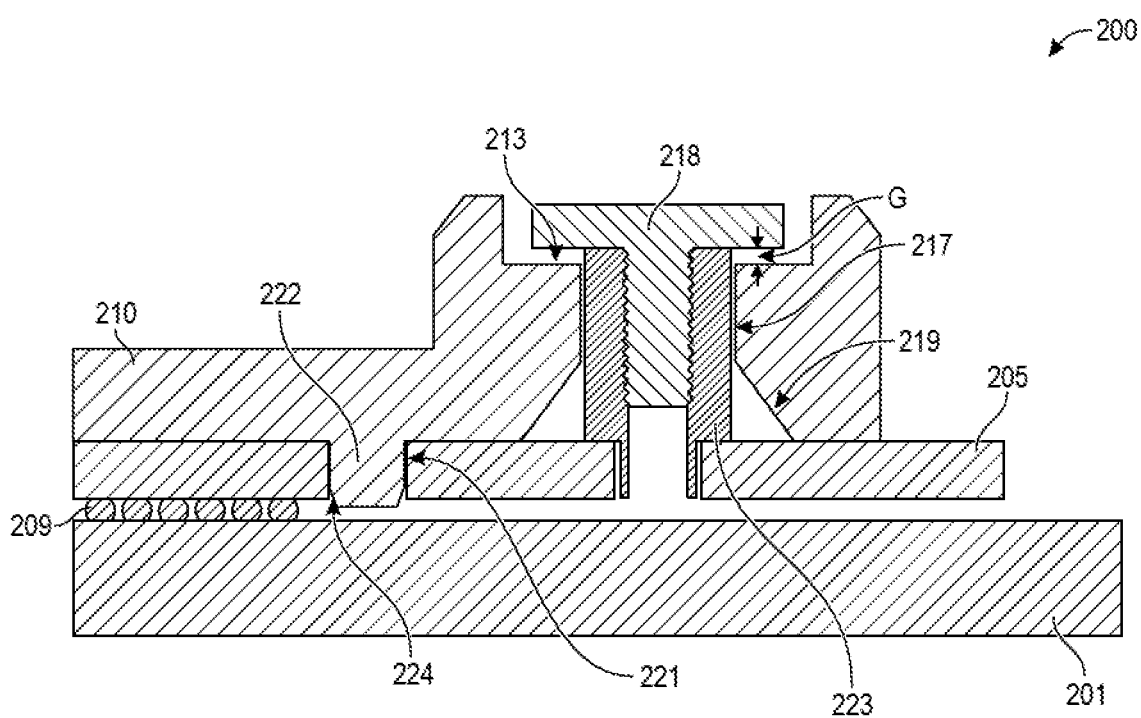
FIG. 2B is a cross-sectional illustration of an electronic package with a pair of alignment features, in accordance with an embodiment.

Referring now to FIG. 2B, a cross-sectional illustration of the electronic package 200 where the housing 210 is secured to the interposer 205 is shown, in accordance with an embodiment. As shown, the interposer 205 may be connected to the board 201 by interconnects 209, such as solder balls. In an embodiment, the alignment standoff 223 is engaged with the hole 217. The hole 217 may comprise a tapered first end 219. The tapered first end 219 allows for the alignment standoff 223 to be guided into the center of the hole 217, even when slightly misaligned. As such, the margin for alignment error on the part of the installation technician is increased. Initial misalignment between the housing 210 and the alignment standoff 223 also does not result in the damage to the CMT interconnect pins 215 since the alignment standoff 223 is engaged by the hole 217 well before the CMT pins 215 contact pads 206 on the interposer 205. Furthermore, it is to be appreciated that the alignment standoff 223 is visible through the hole 217. Accordingly, a visible install is provided as opposed to the use of only a blind install, as described above. In an embodiment, the alignment hole 217 may also comprise a second end that accommodates the head of the fastener 218. For example, the second end may have a diameter that is greater than a diameter of a central region of the hole 217 between the first end and the second end. As shown, the alignment standoff 223 may have a threaded interior surface. The threaded interior surface may mate with a threaded surface of the fastener 218. For example, the fastener 218 may be a screw. The head of the fastener 218 prevents the housing 210 from being removed from the interposer 205.

In an embodiment, the alignment standoff 223 may extend up above a ledge 213 in the alignment hole 217. As such, when the fastener is fully inserted into the alignment standoff 223 a gap G is provided between the head of the fastener 218 and the ledge 213 of the housing 210. That is, the fastener 218 may not apply any force against the housing 210 in some embodiments. Accordingly, the presence of the gap G prevents undesirable preload onto the housing 210. Preventing preload on the housing 210 is particularly beneficial for CMT socket implementations, since some CMT interconnect pin designs need to be symmetrically loaded to prevent damage. If a preload is applied to the housing 210 before the attachment of the CPU, the top portion of the CMT pins 215 will not experience a load, while the bottom portion of the CMT pins 215 will be compressed.

In an embodiment, the second alignment feature includes a protrusion 222 from the bottom surface of the housing 210 that extends into a hole 221 of the interposer 205. The protrusion 222 may comprise a tapered surface 224. The tapered surface increases the margin for alignment error and improves ease of assembly. Accordingly, embodiments include a housing 210 that includes a pair of tapered surfaces (i.e., a tapered first end 219 of the hole 217 and a tapered surface 224 of the protrusion 222) that significantly improves the misalignment margins necessary for proper package assembly.

In FIGS. 2A and 2B, a threaded fastener 218 and a threaded alignment standoff 223 are shown as the attachment mechanism that prevents the housing 210 from being removed from the interposer 205. However, it is to be appreciated that many different attachment architectures are possible, in accordance with various embodiments. For example, FIGS. 3A-5B provide additional attachment architectures that may be used in accordance with various embodiments.

Figure 3A:
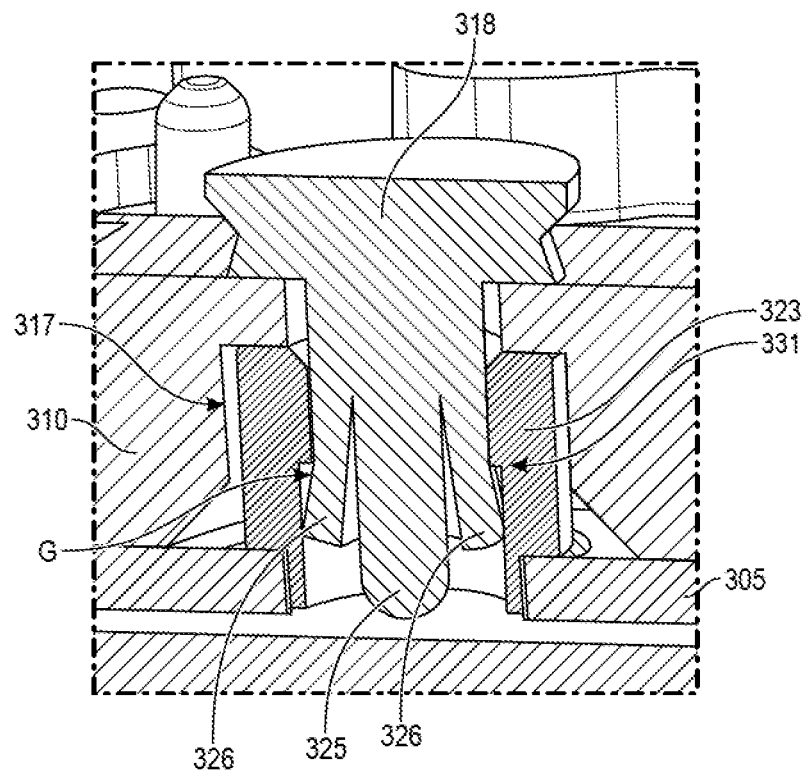
FIG. 3A is a cross-sectional illustration of a fastener mechanism for securing a socket to a board or interposer, in accordance with an embodiment.

Referring now to FIG. 3A, a cross-sectional illustration of the first alignment feature (i.e., the alignment standoff 323 and the hole 317 in the housing 310) is shown, in accordance with an embodiment. Instead of using a threaded screw, the fastener 318 is shown as being a push pin rivet. For example, the fastener 318 may comprise a main post 325 with prongs 326 that extend outward from the main post 325. When inserted into the center of the alignment standoff 323, the one or more prongs 326 are compressed towards the main post 325. After the prongs 326 pass a ledge 331 on the alignment standoff 323, the prongs 326 have room to expand. The ledge 331 then prevents the fastener 318 from being pulled back out of the alignment standoff 323. In an embodiment, a gap G between the edge of the prongs 326 and the ledge 331 may provide the necessary space to prevent preloading of the CMT interconnect pins (not shown). That is, the fastener 318 may prevent removal of the housing 310 from the interposer 305 without putting a compressive load onto the housing 310. The use of such a push pin rivet fastener 318 also allows for an assembly process that does not require a tool.

Figure 3B:
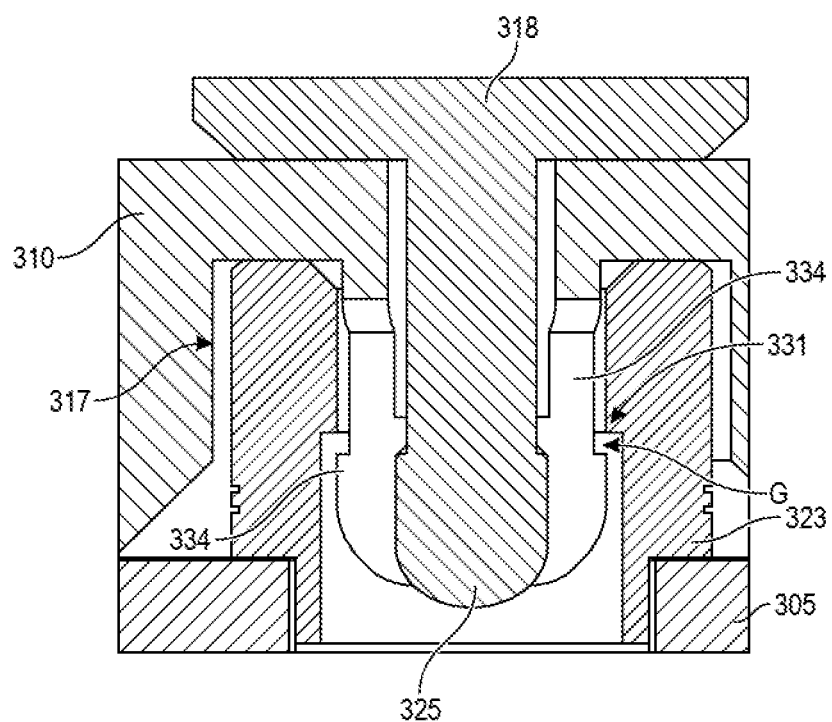
FIG. 3B is a cross-sectional illustration of a fastener mechanism for securing a socket to a board or interposer, in accordance with an embodiment.

Referring now to FIG. 3B, a cross-sectional illustration of the first alignment feature is shown, in accordance with an additional embodiment. In FIG. 3B, the housing 310 may comprise a plurality of prongs 334 that extend down into the hole 317. The prongs 334 fit within an interior diameter of the alignment standoff 323. A fastener 318 is inserted between the prongs 334 in order to secure the prongs 334 to the alignment standoff 323. Particularly, a main post 325 of the fastener causes the prongs 334 to expand away from each other. Once expanded, the prongs 334 engage the ledge 331 when the housing 310 is lifted away from the alignment standoff 323. In an embodiment, a gap G may be provided between the ledge 331 and the prongs 334. The gap G allows for a degree of movement and prevents preloading of the housing 310. The use of such a fastener 318 also allows for an assembly process that does not require a tool. Additionally, moving the prongs 334 to the housing 310 simplifies the structure of the fastener 318 and reduces cost.

Figure 3C:
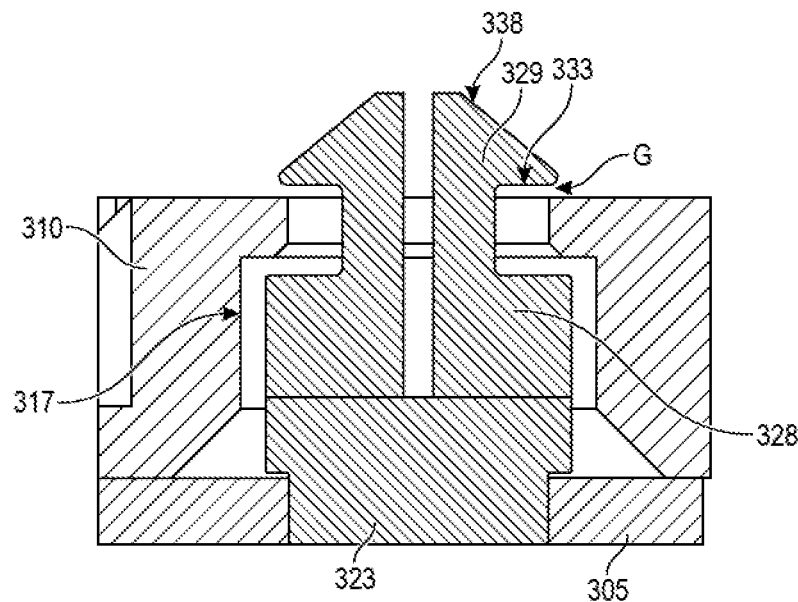
FIG. 3C is a cross-sectional illustration of a fastener mechanism for securing a socket to a board or interposer, in accordance with an embodiment.

Referring now to FIG. 3C, a cross-sectional illustration of the first alignment feature is shown, in accordance with an additional embodiment. The alignment feature in FIG. 3C differs from those in FIGS. 3A and 3B in that there is no need for a discrete fastener. Instead, the attachment mechanism relies on a snap-top feature of the alignment standoff 323. As shown, prongs 328 extend up from the alignment standoff 323. At the top of the prongs 328 a snap feature 329 is provided. When inserted into the hole 317, the snap features 329 are pressed together. Once through the hole 317, the snap features 329 expand to prevent the housing 310 from being removed from the interposer 305. In an embodiment, the snap features 329 may have a substantially triangular cross-section. A bottom surface 333 of the snap features 329 may be substantially parallel to the interposer 305. Angled sidewalls 338 may extend up from the bottom surface 333. In an embodiment, a gap G is provided between the bottom surface 333 and the top surface of the housing 310. The gap G prevents preloading of the housing 310. The use of such a snap-top alignment standoff 323 also allows for an assembly process that does not require a tool.

Figure 3D:
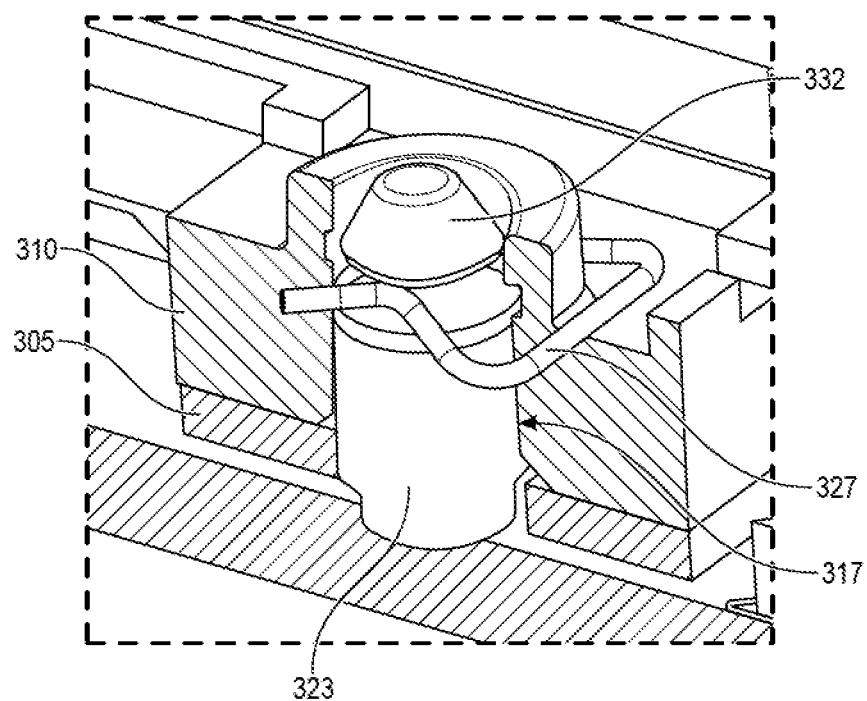
FIG. 3D is a cross-sectional illustration of a fastener mechanism for securing a socket to a board or interposer, in accordance with an embodiment.

Referring now to FIG. 3D, a perspective view illustration of the first alignment feature is shown, in accordance with an additional embodiment. In FIG. 3D, the alignment standoff 323 is prevented from being pulled out of the hole 317 in the housing 310 by a wire 327. The wire 327 may wrap around (or pass through) the alignment standoff 323. The alignment standoff 323 may have a dome shaped head 332. The wire 327 may wrap around the standoff 323 below the dome shaped head 332. In some embodiments, the wire 327 may also pass through a portion of the housing 310. The wire 327 may alternatively be replaced with a metal spring clip in some embodiments. The use of such a wire clip also allows for an assembly process that does not require a tool. Additionally, the wire may be simply removed in order to release the housing 310 from the interposer 305 instead of requiring the use of a tool.

Figure 4:
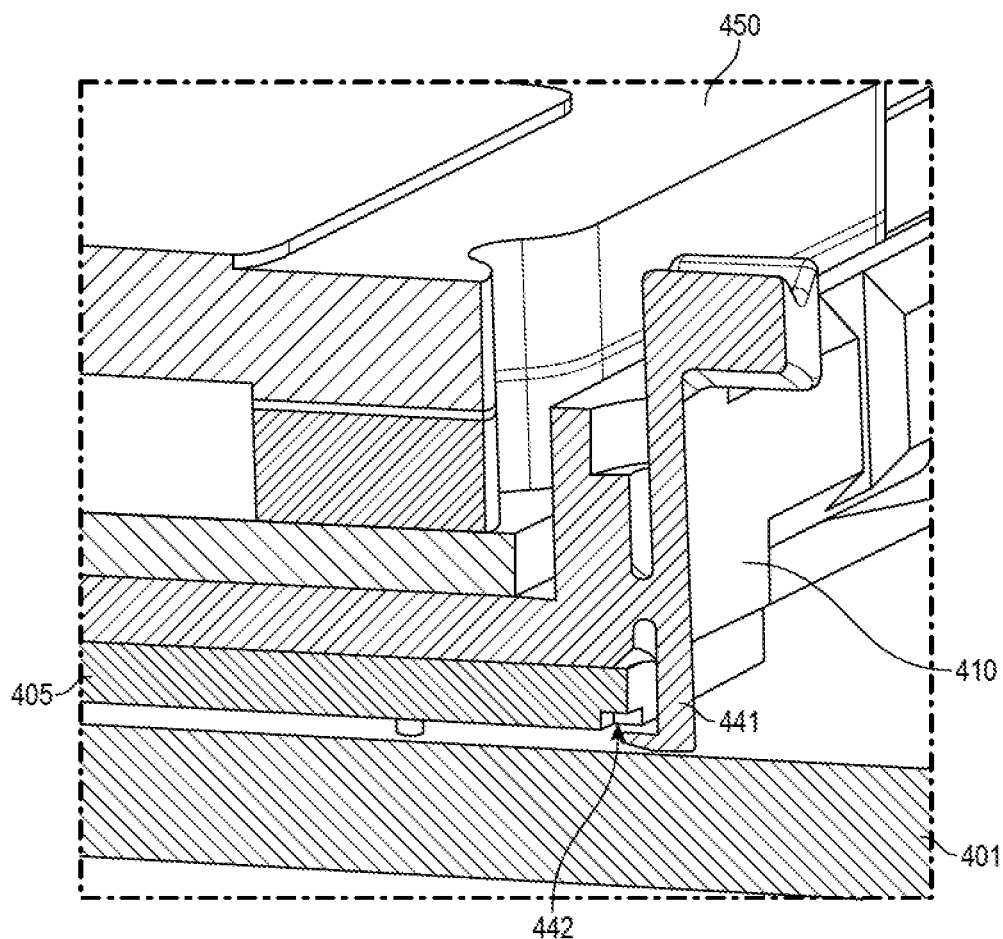
FIG. 4 is a sectional illustration of a socket with an edge clip to the board or interposer, in accordance with an embodiment.

Referring now to FIG. 4, an alternative fastening mechanism is shown, in accordance with an embodiment. Instead of fastening the housing to the interposer 405 using the alignment standoff, the housing 410 is directly connected to the interposer 405 by a clip 441. In an embodiment, the clip 441 is an edge clip. That is, the clip 441 engages the interposer 405 along an edge of the interposer 405. In a particular embodiment, the clip 441 engages a notch 442 that is provided in a bottom surface of the interposer 405. Mating the clip 441 to the notch 442 allows for proper alignment without the need for alignment standoffs.

The standoff height between the interposer 405 and the board 401 is set by press fit, interconnects (not shown) such as solder balls or the like. In order to provide a more repeatable standoff height, copper pillars may also be included between the interposer 405 and the board 401. Advantages of edge clip embodiments include a more efficient use of space around the socket housing 410 and a better socket loading condition. That is, no space needs to be dedicated to an alignment standoff, such as is the case for other embodiments described above so that the loading location can be closer to socket pin field. Additionally, such embodiments maximize the use of space in the keep out zone (KOZ) that cannot be utilized for other components. Furthermore, since alignment standoffs are omitted, the fabrication of the interposer 405 is simplified. Such an embodiment, also allows for an assembly process that does not require tooling. FIG. 4 also illustrates the die and thermal solution 450 that is connected to the socket housing 410. However, it is to be appreciated that any combination of die and thermal solution architecture may be used in accordance with embodiments disclosed herein.

Figure 5A:
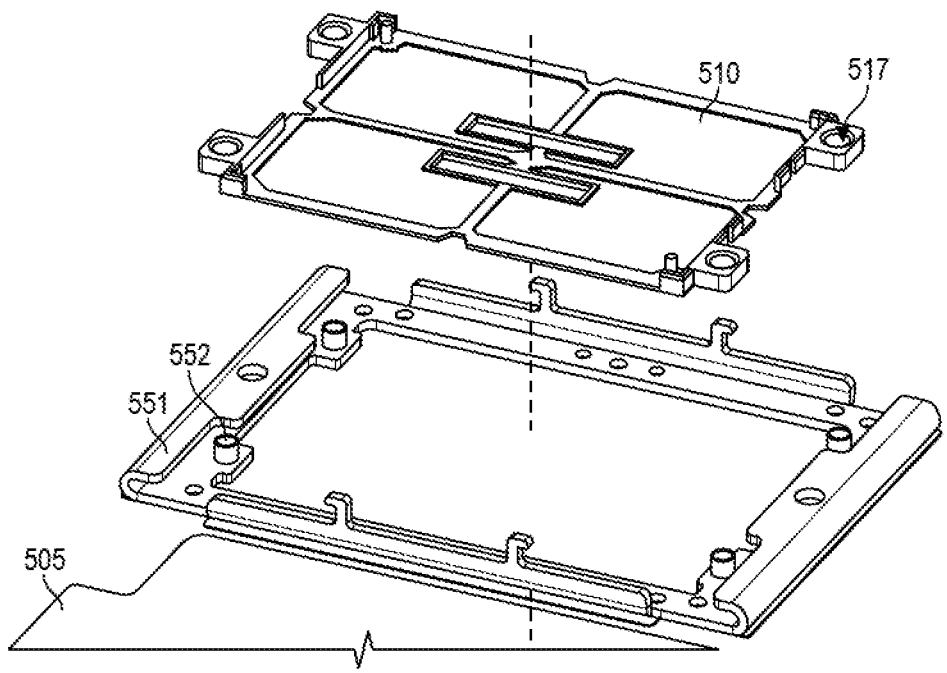
FIG. 5A is a perspective view illustration of a socket and a socket mounting frame, in accordance with an embodiment.
Figure 5B:
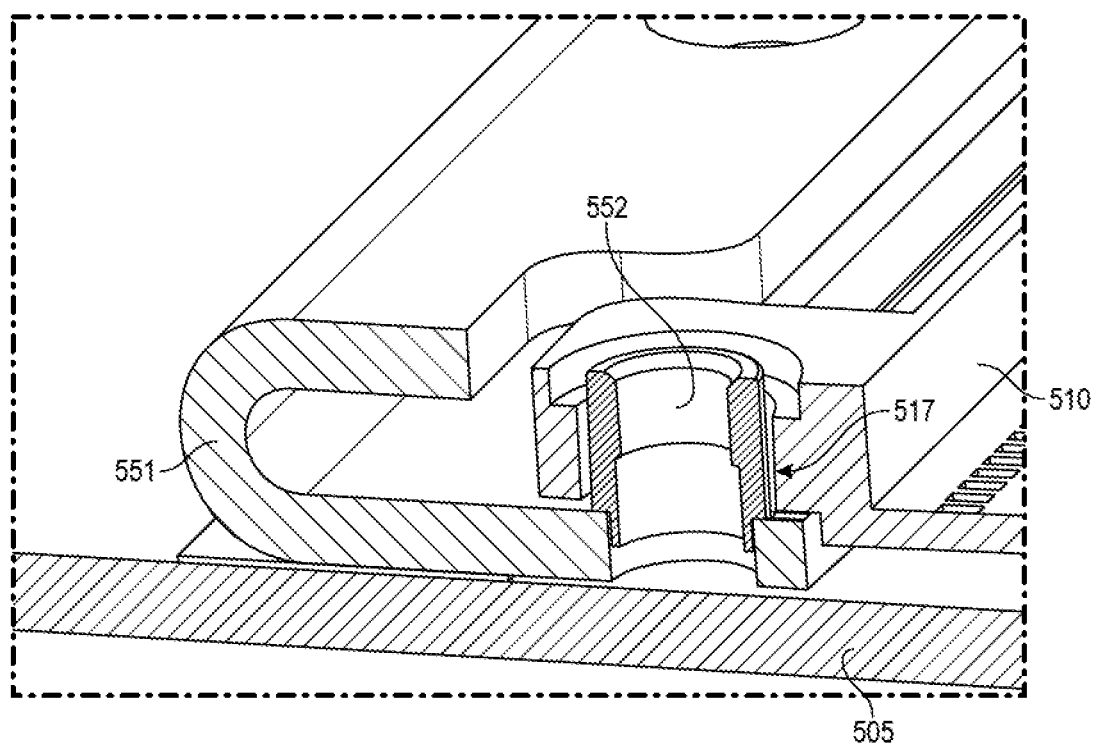
FIG. 5B is a perspective view illustration of a socket and a socket mounting frame with an alignment feature, in accordance with an embodiment.

Referring now to FIGS. 5A and 5B, illustrations depicting an alternative alignment feature is provided, in accordance with an embodiment. Instead of providing alignment standoffs on the interposer 505, alignment standoffs 552 are provided on a loading frame 551. As shown, the socket housing 510 includes holes 517 that are provided along the edge of the housing. In the exploded view of FIG. 5A, the holes 517 are aligned over the alignment standoffs 552 on the loading frame 551.

Referring now to FIG. 5B, a sectional illustration of that more clearly illustrates the alignment feature is shown, in accordance with an embodiment. As shown, the loading frame 551 has an alignment standoff 552. The socket housing 510 comprises a hole 517 through which the alignment standoff 552 is inserted. In an embodiment, the alignment standoff 552 may be secured to the socket housing 510 using any of the attachment features described above with respect to FIGS. 3A-3D.

Providing the socket housing 510 and the loading frame 551 together has several advantages. For example, the socket housing 510 and the loading frame 551 are typically acquired from a single supplier. As such, coupling the two of them together can save on packaging and shipping costs, as well as reducing assembly complexity. In an embodiment, the alignment features (e.g., similar to those described above) may also be provided on the interposer 505 (or board) to provide for the medium alignment, with the alignment feature shown in FIG. 5B being used to provide the fine alignment.

FIGS. 2A-5B provide illustrations and examples of alignment features that allow for a visible coarse alignment followed by a fine alignment. As such, potential damage to the interconnect pins of the socket and/or to the pads on the interposer (or board) is minimized. Additional embodiments are directed to improvements in the shipping and handling of the socket and interposer. In a first embodiment, the socket and interposer are kept separate from each other. By maintaining a gap between the socket and the interposer, there is no risk of the interconnect pins scratching or otherwise damaging the pads due to vibrations or shock during shipping. In an additional embodiment, the CMT interconnect pins are compressed against the pads to prevent vibration damage. Particularly, the CMT interconnect pins are compressed symmetrically in order to minimize damage to the CMT interconnect pins attributable to asymmetric loading of the CMT interconnect pins.

Figure 6A:
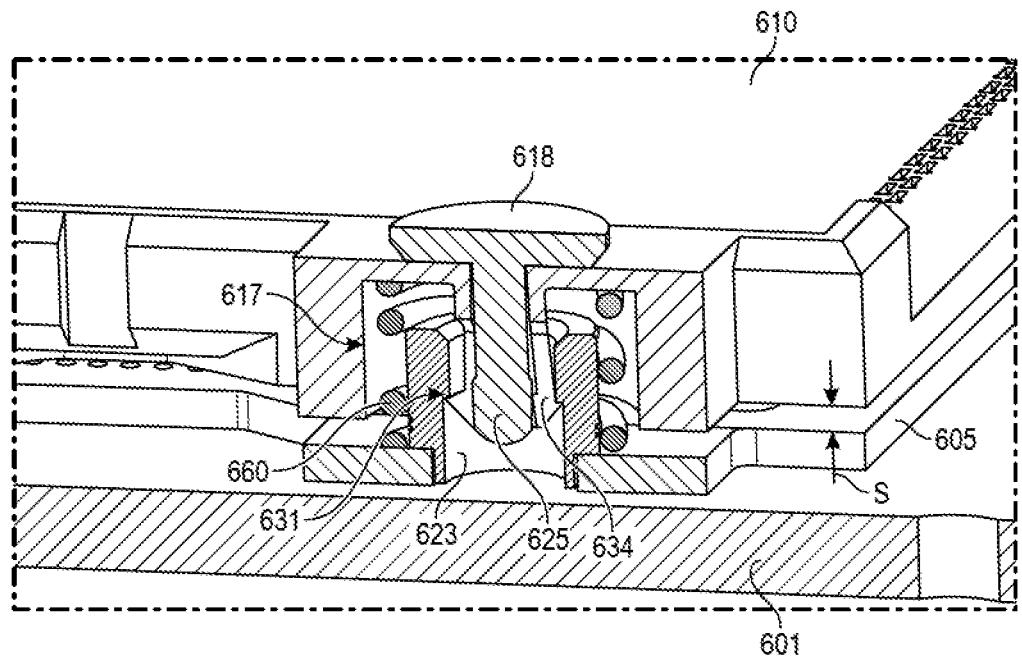
FIG. 6A is a sectional illustration of an electronic package with a socket that is raised up from the substrate, in accordance with an embodiment.

Referring now to FIG. 6A, a cross-sectional illustration of the mechanical connection between the housing 610 and the interposer 605 is shown, in accordance with an embodiment. The connection architecture in FIG. 6A illustrates a connection that allows for the CMT interconnect pins to float (or be suspended) above the pads. In an embodiment, the interposer 605 is attached over a board 601. However, in other embodiments, the interposer 605 may be omitted, and the socket housing 610 may be connected directly to the board 601.

In an embodiment, the interposer 605 comprises an alignment standoff 623. The alignment standoff 623 may interface with a hole 617 in the housing 610. In the particular embodiment shown in FIG. 6A, the housing 610 comprises prongs 634 that are inserted into a center of the alignment standoff 623. A fastener 618 with a main post 625 expands the prongs 634 in order to engage the housing 610 to the alignment standoff 623. However, it is to be appreciated that any connection architecture between the housing 610 and the alignment standoff 623 may be used. For example, any of the architectures in FIGS. 3A-3D may be used to couple the housing 610 to the interposer 605.

In an embodiment, a spring 660 is provided around the alignment standoff 623. The spring 660 may be compressed between the housing 610 and the interposer 605. The spring 660 provides an upward force to the housing 610 that results in the prongs 634 being secured against a ledge 631 on the interior of the alignment standoff 623. Raising the housing 610 with the spring 660 results in a gap S being provided between a bottom surface of the housing 610 and a top surface of the interposer 605. The gap S may be sufficient to keep the CMT interconnect pins (not shown) from contacting pads on the interposer 605. In an embodiment, the gap S may be approximately 1.0 mm or greater. As such, during shipping, vibrations and shock will not result in damage to either the CMT interconnect pins or the pads on the interposer 605. Additionally, such a configuration allows for the gap S to be provided without any loading on the CMT interconnect pins.

In the illustrated embodiment, the spring 660 is shown as a helical coil spring. However, it is to be appreciated that the spring 660 may include any type of spring that is positioned between the housing 610 and the interposer 605. For example, the spring 660 may comprise a torsional spring, a leaf spring, or a wave spring. Additionally, while illustrated as surrounding the alignment standoff 623, the spring 660 may be positioned at any suitable position between the interposer 605 and the housing 610.

Figure 6B:
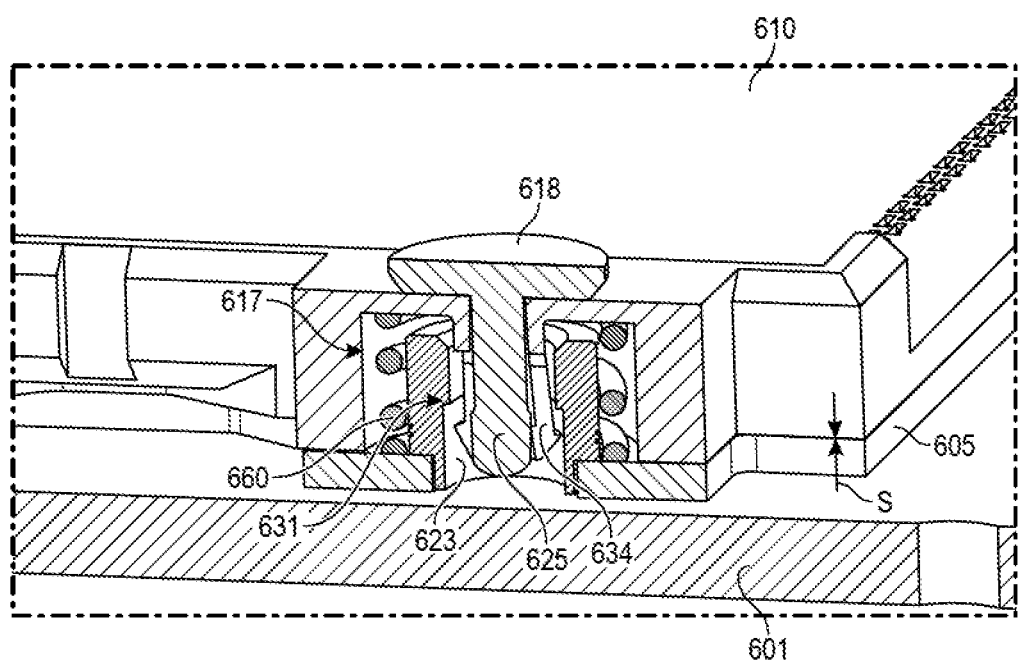
FIG. 6B is a sectional illustration of the electronic package in FIG. 6A that is compressed, in accordance with an embodiment.

Referring now to FIG. 6B, a sectional illustration of the connection in FIG. 6A after being loaded is shown, in accordance with an embodiment. The loading may occur when a die and/or cooling solution (not shown) is attached to the integrated heat spreader (IHS) top surface of the CPU package (not shown) that seats on the socket housing 610. The loading compresses the spring 660 so that the prongs 634 no longer interface with the ledge 631, and the gap S between the housing 610 and the interposer 605 is reduced. In some embodiments, the gap S may be reduced to zero. The force needed to compress the spring 660 may be significantly less than the force needed to connect the die and the cooling solution. As such, there is no significant increase in assembly complexity. In fact, the force of the springs 660 may provide the benefit of biasing the load slightly away from the corners of the package.

While FIGS. 6A and 6B illustrate a floating CMT interconnect pin embodiment, embodiments are not limited to such configurations. In some embodiments, the CMT interconnect pins are pre-loaded or compressed. Such pre-loading prevents relative movement between the bottom side of CMT interconnect pins and pads during shipping. The pre-load can be removed during CPU package assembly and provide a symmetric loading condition for CMT. Such symmetric loading condition can avoid damage to the CMT interconnect pins that may otherwise occur when asymmetric loading is applied to the CMT interconnect pins.

Figure 7A:
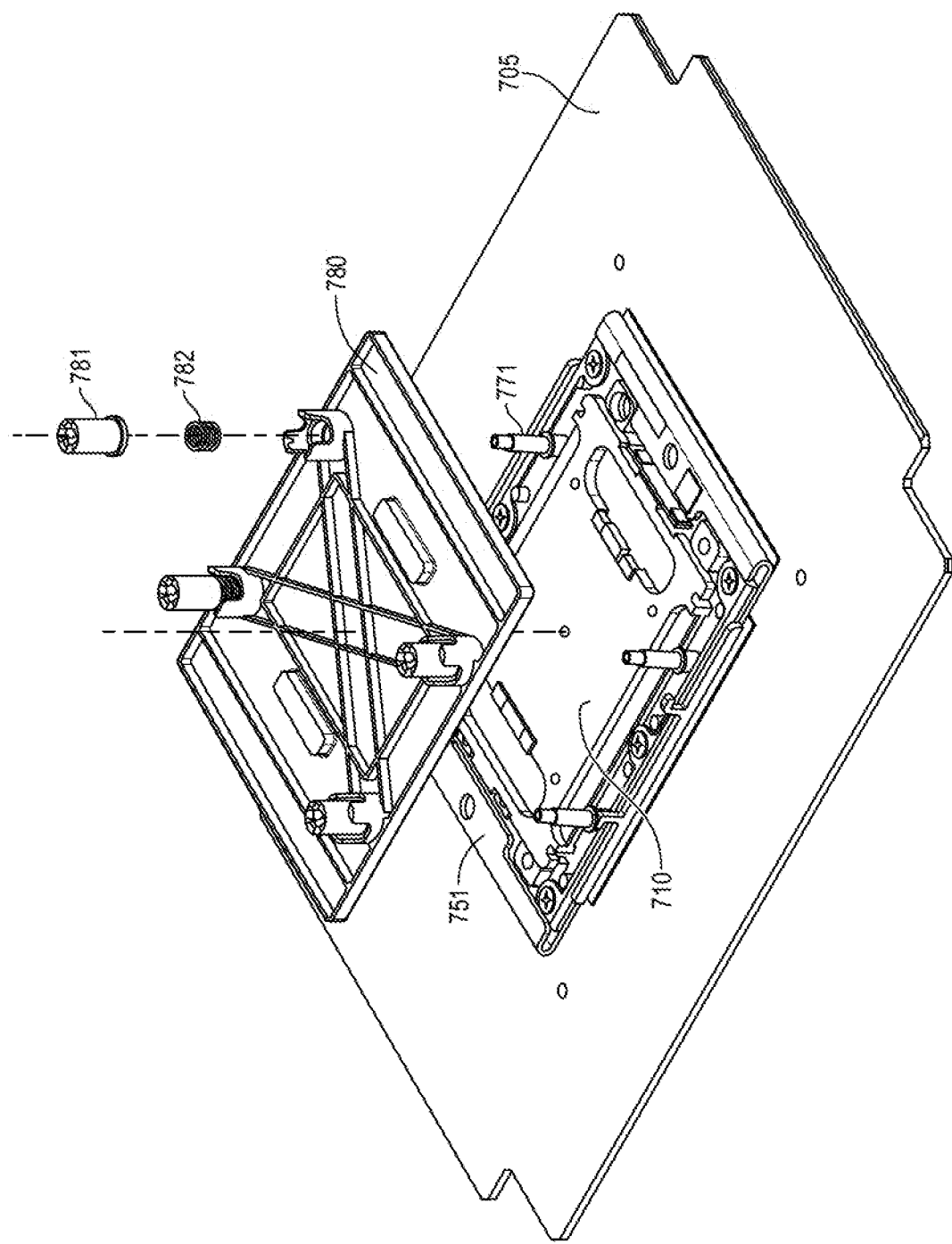
FIG. 7A is an exploded view illustration of an electronic package with a retention cover over the socket with a pick and place (PnP) cap, in accordance with an embodiment.

Referring now to FIG. 7A, an exploded view illustration of an electronic package that implements pre-loading of the CMT interconnect pins is shown, in accordance with an embodiment. The electronic package comprises an interposer (or board) 705. A loading frame 751 is connected to the interposer 705, and a socket assembly (i.e., a housing and a pick and place (PnP) cap) 710 is provided over the loading frame 751. In an embodiment, load posts 771 extend up from the interposer 705.

In an embodiment, a retention cover 780 fits over the load posts 771. In an embodiment, the top of the load posts are secured by nuts 781. A spring 782 may be provided between the nut 781 and a backside surface of the retention cover 780. For example, the spring 782 may be a helical coil spring that is retained between the nut 781 and the retention cover 780.

Figure 7B:
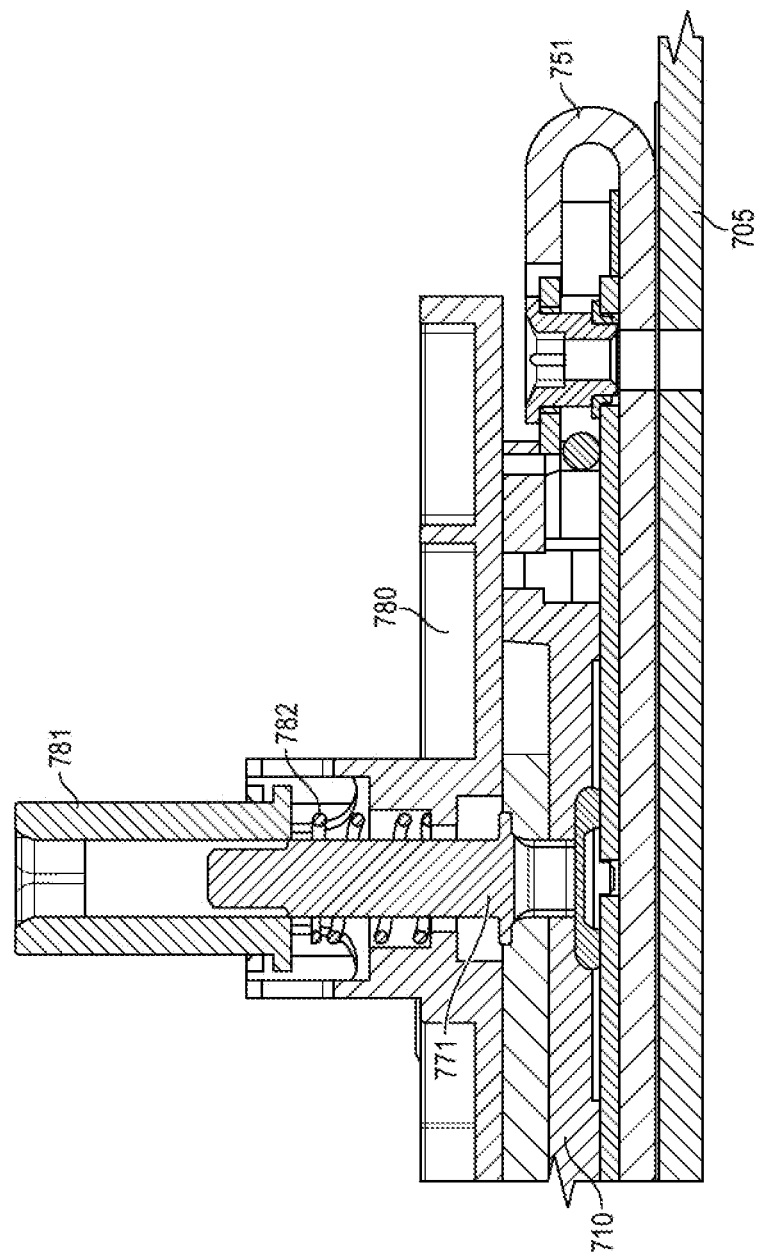
FIG. 7B is a cross-sectional illustration of the electronic package in FIG. 7A, in accordance with an embodiment.

Referring now to FIG. 7B, a sectional illustration of the mechanical connection in FIG. 7A is shown, in accordance with an embodiment. As shown, the load post 771 extends up through the housing 710 and the retention cover 780. The nut 781 is secured to the top of the load post 771. For example, the nut 781 may be threaded over the end of the load post 771. In an embodiment, the spring 782 surrounds the load post 771. The spring 782 is retained between the bottom surface of the nut 781 and the backside surface of the retention cover 780. Since the top end of the spring 782 is retained by the nut 781 (which is coupled to the interposer 705 through the load post 771), the spring applies a downward force on the retention cover 780. The downward force results in the CMT interconnect pins (not shown) being compressed from above by the retention cover 780 and from below by the interposer 705.

Figure 8A:
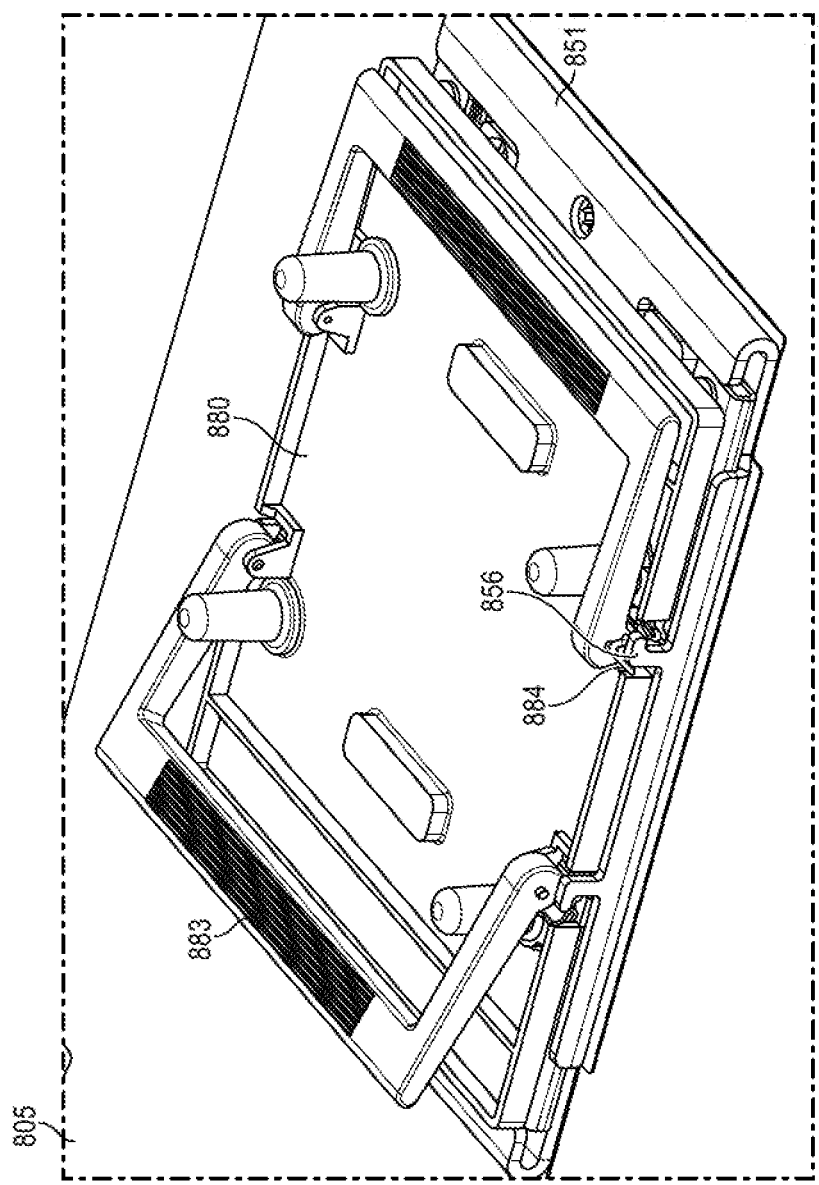
FIG. 8A is a perspective view illustration of an electronic package with a retention cover with spring loaded handles, in accordance with an embodiment.

Referring now to FIG. 8A, a perspective view illustration of an electronic package with a retention cover 880 that is secured using spring loaded handles 883 is shown, in accordance with an embodiment. The use of spring loaded handles is particularly beneficial because assembly does not require any tools. The technician only needs to snap down the handles in order to provide the force to symmetrically compress the CMT interconnect pins. In the illustrated embodiment, a pair of handles 883 are shown. Each handle 883 includes ends that are coupled to opposing edges of the retention cover 880. In the unactuated state (e.g., the left handle 883), the handle 883 is positioned away from the retention cover 880, and in the actuated state (e.g., the right handle 883), the handle 883 is pressed against the retention cover 880 so that the handle 883 is substantially parallel to the retention cover 880.

As shown in FIG. 8A, each end of the handles 883 may incorporate a spring mechanism 884. The spring mechanism 884 may interface with a flange 856 on the socket loading frame 851. When compressed, the spring mechanism 884 supplies a force that brings together the retention cover 880 and the socket loading frame 851. Since the socket loading frame 851 is mechanically coupled to the interposer 805, the CMT interconnect pins passing through the housing (not shown) are symmetrically compressed.

Figure 8B:
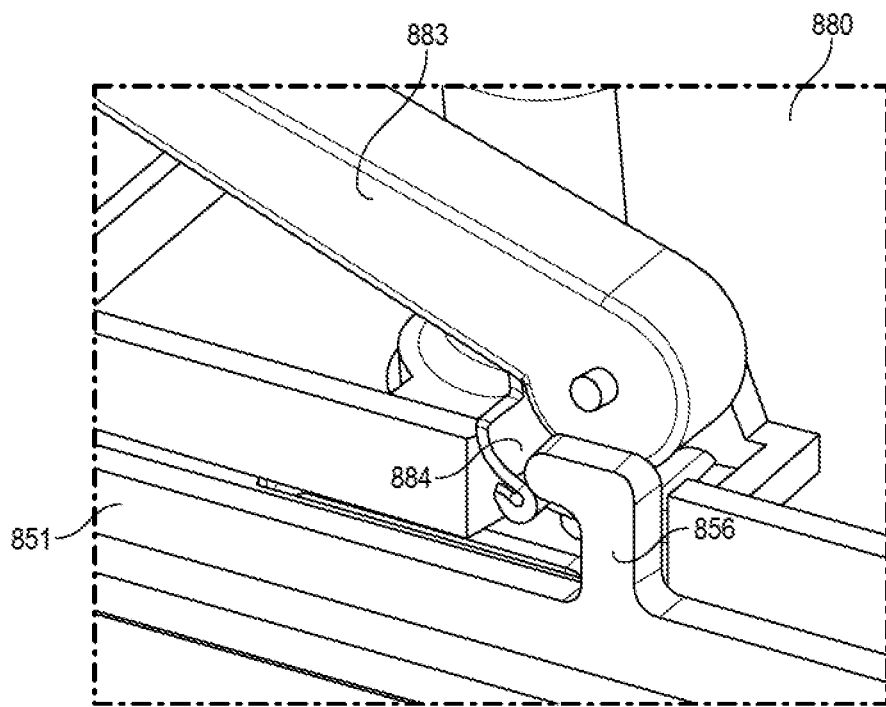
FIG. 8B is a zoomed in illustration of the retention mechanism in FIG. 8A, in accordance with an embodiment.
Figure 8C:
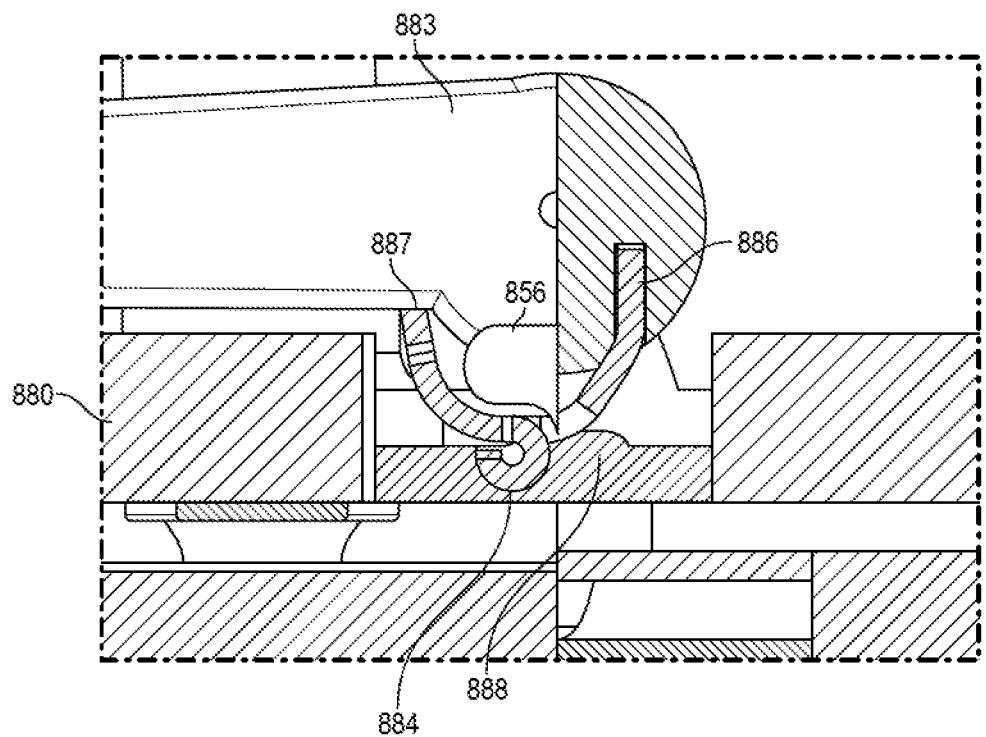
FIG. 8C is a cross-sectional illustration of the retention mechanism of FIG. 8B, in accordance with an embodiment.

Referring now to FIG. 8B, a zoomed in illustration of the spring mechanism 884 is shown, in accordance with an embodiment. As shown, when the handle 883 is actuated, the spring 884 is brought into contact with the flange 856. The actuation mechanism is more clearly illustrated in the cross-sectional illustration shown in FIG. 8C. As shown, a first end of the spring 886 is embedded in the base of the handle 883. The second end 887 of the spring 886 is pressed against a surface of the handle 883. As the handle is brought down, the spring loop 884 is compressed between the flange 856 and a cam 888 of the retention cover 880.

Figure 9A:
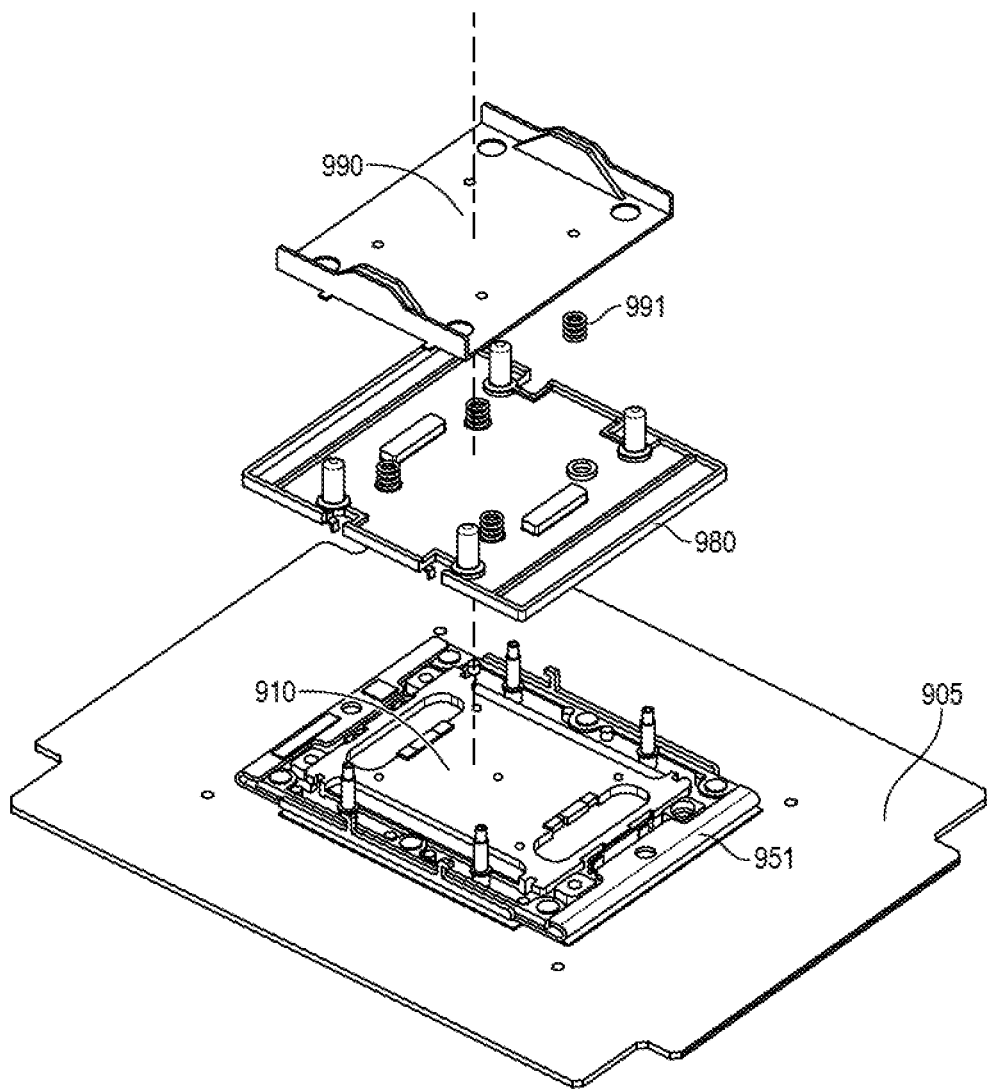
FIG. 9A is an exploded view illustration of an electronic package with a retention cover that is secured by a handle plate, in accordance with an embodiment.

Referring now to FIG. 9A, an exploded view illustration of an electronic package is shown, in accordance with an additional embodiment. As shown, the electronic package comprises an interposer (or board) 905, a retention frame 951, and a socket housing 910. In an embodiment, a retention cover 980 is applied over the socket housing 910. In an embodiment, a handle plate 990 presses against the retention cover 980 with springs 991 between the handle plate 990 and retention cover 980.

Figure 9B:
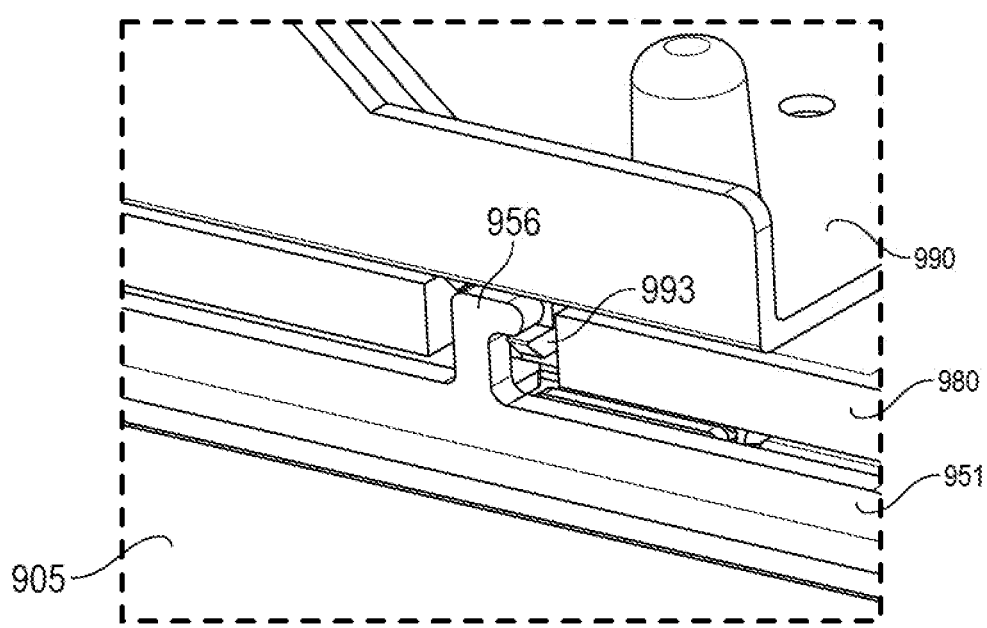
FIG. 9B is a perspective view illustration of the retention mechanism of FIG. 9A, in accordance with an embodiment.

Referring now to FIG. 9B, a zoomed in illustration of an assembled package is shown, in accordance with an embodiment. As shown, the handle plate 990 may comprise a latch point 993. Each of the latch points 993 may interface with a flange 956 on the retention frame 951. The handle plate 990 is pressed down (to compress the springs 991 (not visible in FIG. 9B)). The latch point 993 is then engaged against the flange 956, with the springs applying a downward force on the retention cover 980 to provide a symmetric loading of the CMT interconnect pins. The embodiment shown in FIGS. 9A and 9B is also a tool-less install operation. As such, assembly and disassembly of the retention cover 980 is simplified.

Figure 10:
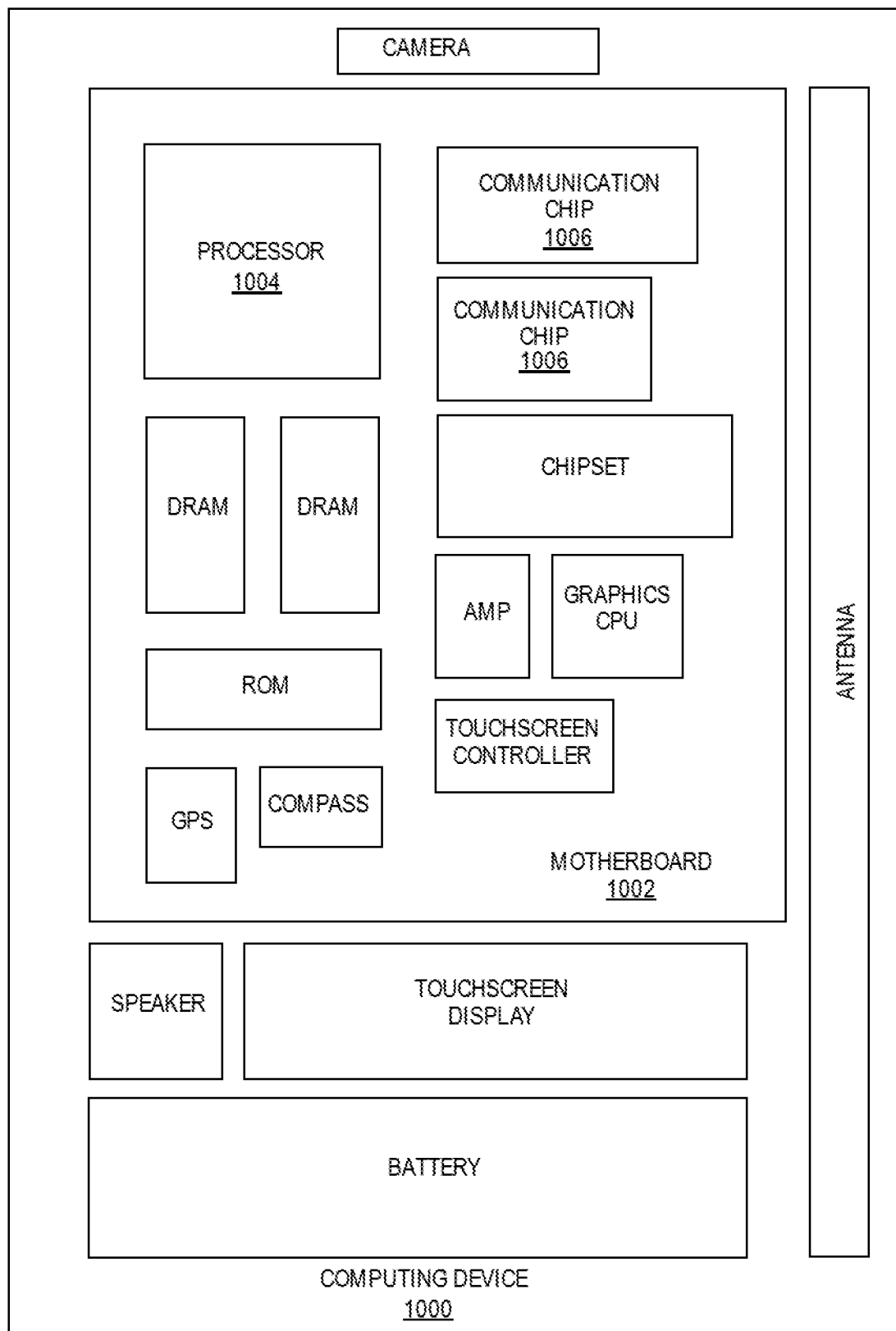
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may part of an electronic package that includes a CMT socket that utilizes a visible coarse alignment and a fine alignment, and/or a package that is shipped with floating socket pins or symmetrically loaded socket pins, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be coupled to an electronic package that includes a CMT socket that utilizes a visible coarse alignment and a fine alignment, and/or a package that is shipped with floating socket pins or symmetrically loaded socket pins, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a socket, comprising: a housing with a first surface and a second surface; a plurality of interconnect pins passing through the housing; an alignment hole through the housing; and an alignment post extending out from the first surface of the housing.

Example 2: the socket of Example 1, wherein the alignment hole is tapered at the first surface.

Example 3: the socket of Example 1 or Example 2, wherein the alignment hole has a first diameter at the second surface and a second diameter between the first surface and the second surface, wherein the second diameter is smaller than the first diameter.

Example 4: the socket of Examples 1-3, wherein the plurality of interconnect pins are compression mounted technology (CMT) interconnect pins.

Example 5: the socket of Example 4, wherein the plurality of interconnect pins comprise a middle interface feature.

Example 6: the socket of Examples 1-5, wherein the alignment post has a tapered surface.

Example 7: an electronic package, comprising: a substrate, wherein the substrate comprises a first alignment hole; an alignment standoff extending up from the substrate; and a socket attached to the substrate, wherein the socket comprises: a housing; an alignment post extending out from the housing, wherein the alignment post is inserted into the first alignment hole; and a second alignment hole, wherein the alignment standoff is inserted into the second alignment hole.

Example 8: the electronic package of Example 7, further comprising: a fastener provided through the second alignment hole, wherein the fastener secures the substrate to the socket.

Example 9: the electronic package of Example 8, wherein an interior of the alignment standoff is threaded, and wherein the fastener is a screw.

Example 10: the electronic package of Example 8, wherein the fastener is a push rivet.

Example 11: the electronic package of Example 8, wherein the housing further comprises rivet prongs, wherein the rivet prongs extend into an interior of the alignment standoff, and wherein the fastener engages the rivet prongs against the interior of the alignment standoff to secure the substrate to the socket.

Example 12: the electronic package of Examples 7-11, wherein an end of the alignment standoff has prongs that can compress together as the alignment standoff passes through the second alignment hole and expand after passing through the second alignment hole to secure the substrate to the socket.

Example 13: the electronic package of Examples 7-12, wherein the substrate is an interposer.

Example 14: the electronic package of Examples 7-12, wherein the substrate is a printed circuit board.

Example 15: the electronic package of Examples 7-14, wherein the socket further comprises a plurality of interconnect pins passing through the housing.

Example 16: the electronic package of Example 15, wherein the plurality of interconnect pins are compression mounted technology (CMT) interconnect pins.

Example 17: the electronic package of Example 16, wherein the plurality of CMT interconnect pins comprise a middle interface feature.

Example 18: an electronic system, comprising: a substrate with an alignment standoff and a first alignment hole; a socket attached to the substrate, wherein the socket is aligned to the substrate with a protrusion that inserts into the first alignment hole, and wherein the alignment standoff passes through a second alignment hole in the socket, and wherein an entrance to the second alignment hole is tapered.

Example 19: the electronic system of Example 18, wherein the socket is attached to the substrate by a fastener that is inserted into the second alignment hole at an entrance to the second alignment hole that is opposite from the tapered end.

Example 20: the electronic system of Example 19, wherein the fastener is a screw, and wherein an interior surface of the alignment standoff is threaded to receive the screw.

What is claimed is:

1. A socket, comprising:
   a monolithic housing with a first surface and a second surface, the monolithic housing comprising an alignment post extending from the first surface;
   a plurality of interconnect pins passing through the monolithic housing; and
   an alignment hole through the monolithic housing, wherein the alignment hole is tapered at the first surface.

2. The socket of claim 1, wherein the alignment hole has a first diameter at the second surface and a second diameter between the first surface and the second surface, wherein the second diameter is smaller than the first diameter.

3. The socket of claim 1, wherein the plurality of interconnect pins are compression mounted technology (CMT) interconnect pins.

4. The socket of claim 3, wherein the plurality of interconnect pins comprise a middle interface feature.

5. The socket of claim 1, wherein the alignment post has a tapered surface.

6. An electronic package, comprising:
   a substrate, wherein the substrate comprises a first alignment hole;
   an alignment standoff extending up from the substrate; and
   a socket attached to the substrate, wherein the socket comprises:
      a monolithic housing, the monolithic housing comprising an alignment post extending from a surface of the monothic housing, wherein the alignment post is inserted into the first alignment hole;
      a second alignment hole, wherein the alignment standoff is inserted into the second alignment hole; and
      a fastener provided through the second alignment hole, wherein the fastener secures the substrate to the socket.

7. The electronic package of claim 6, wherein an interior of the alignment standoff is threaded, and wherein the fastener is a screw.

8. The electronic package of claim 6, wherein the fastener is a push rivet.

9. The electronic package of claim 6, further comprising rivet prongs, wherein the rivet prongs extend into an interior of the alignment standoff, and wherein the fastener engages the rivet prongs against the interior of the alignment standoff to secure the substrate to the socket.

10. The electronic package of claim 6, wherein an end of the alignment standoff has prongs that can compress together as the alignment standoff passes through the second alignment hole and expand after passing through the second alignment hole to secure the substrate to the socket.

11. The electronic package of claim 6, wherein the substrate is an interposer.

12. The electronic package of claim 6, wherein the socket further comprises a plurality of interconnect pins passing through the monolithic housing.

13. The electronic package of claim 12, wherein the plurality of interconnect pins are compression mounted technology (CMT) interconnect pins.

14. The electronic package of claim 13, wherein the plurality of CMT interconnect pins comprise a middle interface feature.

15. An electronic system, comprising:
   a substrate with an alignment standoff and a first alignment hole;
   a socket attached to the substrate, wherein the socket is aligned to the substrate with a protrusion that inserts into the first alignment hole, and wherein the alignment standoff passes through a second alignment hole in the socket, and wherein an entrance to the second alignment hole is tapered.

16. The electronic system of claim 15, wherein the socket is attached to the substrate by a fastener that is inserted into the second alignment hole at an entrance to the second alignment hole that is opposite from the tapered end.

17. The electronic system of claim 16, wherein the fastener is a screw, and wherein an interior surface of the alignment standoff is threaded to receive the screw.

18. An electronic package, comprising:
   a substrate, wherein the substrate is an interposer, and wherein the substrate comprises a first alignment hole;
   an alignment standoff extending up from the substrate; and
   a socket attached to the substrate, wherein the socket comprises:
      a housing;
      an alignment post extending out from the housing, wherein the alignment post is inserted into the first alignment hole; and
      a second alignment hole, wherein the alignment standoff is inserted into the second alignment hole.

19. A socket, comprising:
   a monolithic housing with a first surface and a second surface, the monolithic housing comprising an alignment post extending from the first surface;
   a plurality of interconnect pins passing through the monolithic housing; and
   an alignment hole through the monolithic housing, wherein the alignment hole has a first diameter at the second surface and a second diameter between the first surface and the second surface, wherein the second diameter is smaller than the first diameter.

20. A socket, comprising:
   a monolithic housing with a first surface and a second surface, the monolithic housing comprising an alignment post extending from the first surface;
   a plurality of interconnect pins passing through the monolithic housing, wherein the plurality of interconnect pins are compression mounted technology (CMT) interconnect pins; and
   an alignment hole through the monolithic housing.

21. The socket of claim 20, wherein the plurality of interconnect pins comprise a middle interface feature.

22. An electronic package, comprising:
   a substrate, wherein the substrate comprises a first alignment hole;
   an alignment standoff extending up from the substrate; and a socket attached to the substrate, wherein the socket comprises:
　　a monolithic housing, the monolithic housing comprising an alignment post extending from a surface of the monothic housing, wherein the alignment post is inserted into the first alignment hole; and
　　a second alignment hole, wherein the alignment standoff is inserted into the second alignment hole, wherein an end of the alignment standoff has prongs that can compress together as the alignment standoff passes through the second alignment hole and expand after passing through the second alignment hole to secure the substrate to the socket.

23. An electronic package, comprising:
a substrate, wherein the substrate is an interposer, and wherein the substrate comprises a first alignment hole;
an alignment standoff extending up from the substrate; and
a socket attached to the substrate, wherein the socket comprises:
　　a monolithic housing, the monolithic housing comprising an alignment post extending from a surface of the monothic housing, wherein the alignment post is inserted into the first alignment hole; and
　　a second alignment hole, wherein the alignment standoff is inserted into the second alignment hole.

24. An electronic package, comprising:
a substrate, wherein the substrate comprises a first alignment hole;
an alignment standoff extending up from the substrate; and
a socket attached to the substrate, wherein the socket comprises:
　　a monolithic housing, the monolithic housing comprising an alignment post extending from a surface of the monothic housing, wherein the alignment post is inserted into the first alignment hole;
　　a second alignment hole, wherein the alignment standoff is inserted into the second alignment hole; and
a plurality of interconnect pins passing through the monolithic housing, wherein the plurality of interconnect pins are compression mounted technology (CMT) interconnect pins.

25. The electronic package of claim 24, wherein the plurality of CMT interconnect pins comprise a middle interface feature.

* * * * *